United States Patent
Cheng et al.

(10) Patent No.: US 9,240,447 B1
(45) Date of Patent: Jan. 19, 2016

(54) FINFETS CONTAINING IMPROVED STRAIN BENEFIT AND SELF ALIGNED TRENCH ISOLATION STRUCTURES

(71) Applicant: International Business Machines Corporation, Armonk, NY (US)

(72) Inventors: Kangguo Cheng, Schenectady, NY (US); Johnathan E. Faltermeier, Delanson, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/465,365

(22) Filed: Aug. 21, 2014

(51) Int. Cl.
| | |
|---|---|
| *H01L 29/06* | (2006.01) |
| *H01L 29/66* | (2006.01) |
| *H01L 21/02* | (2006.01) |
| *H01L 21/762* | (2006.01) |
| *H01L 21/311* | (2006.01) |

(52) U.S. Cl.
CPC ...... *H01L 29/0649* (2013.01); *H01L 21/02636* (2013.01); *H01L 21/02639* (2013.01); *H01L 21/31116* (2013.01); *H01L 21/76232* (2013.01); *H01L 21/76237* (2013.01); *H01L 29/6681* (2013.01)

(58) Field of Classification Search
CPC .................................................. H01L 29/0649
USPC ......................................................... 438/253
See application file for complete search history.

(56) References Cited

U.S. PATENT DOCUMENTS

| | | | |
|---|---|---|---|
| 6,885,055 | B2 | 4/2005 | Lee |
| 8,039,326 | B2 | 10/2011 | Knorr et al. |
| 8,129,763 | B2 | 3/2012 | Bjoerk et al. |
| 8,274,097 | B2 | 9/2012 | Cheng |
| 8,502,263 | B2 | 8/2013 | Li et al. |
| 8,530,934 | B2 | 9/2013 | Enicks et al. |
| 2003/0089899 | A1 | 5/2003 | Lieber et al. |
| 2009/0200540 | A1 | 8/2009 | Bjoerk et al. |
| 2011/0012090 | A1 | 1/2011 | Singh et al. |
| 2011/0233512 | A1 | 9/2011 | Yang et al. |

FOREIGN PATENT DOCUMENTS

| | | |
|---|---|---|
| WO | WO2007022359 A2 | 2/2007 |
| WO | WO2009072984 | 6/2009 |

*Primary Examiner* — Anthony Ho
(74) *Attorney, Agent, or Firm* — Scully, Scott, Murphy & Presser, P.C.; Steven J. Meyers, Esq.

(57) ABSTRACT

A first array of semiconductor fins and a second array of semiconductor fins are provided on a bulk semiconductor portion of a bulk semiconductor substrate. Each semiconductor fin of the first and second arrays is spaced apart by a first gap, and the outermost semiconductor fins of the first and second arrays of semiconductor fins are spaced apart by a second gap that is wider than the first gap. A sacrificial material is formed which completely fills the first gap, but not the second gap. An etch is employed to provide trenches into the bulk semiconductor portion which have sidewall surfaces self aligned to sidewall surfaces of sacrificial spacer structures that are formed during this etch. A trench isolation structure is formed into each trench and thereafter a functional gate structure is formed surrounding each semiconductor fin.

20 Claims, 6 Drawing Sheets

FINFETS CONTAINING IMPROVED STRAIN BENEFIT AND SELF ALIGNED TRENCH ISOLATION STRUCTURES

BACKGROUND

The present application relates to a non-planar semiconductor structure and a method of forming the same. More particularly, the present application relates to a method of forming a self aligned trench isolation structure between various arrays of semiconductor fins and to enable bottom up epitaxial growth of a semiconductor material to enhance strain benefit within the resultant non-planar semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

One known problem with conventional finFETs is the diminishing stain benefit due to difficulty in growing high quality epitaxial silicon germanium alloys from semiconductor fins that are narrowly spaced apart. Thus, a method is needed that solves this and other problems that are associated with forming finFETs.

SUMMARY

A first array of semiconductor fins and a second array of semiconductor fins are provided on a bulk semiconductor portion of a bulk semiconductor substrate. Each semiconductor fin of the first and second arrays is spaced apart by a first gap, and the outermost semiconductor fins of the first and second arrays of semiconductor fins are spaced apart by a second gap that is wider than the first gap. A sacrificial material is formed which completely fills the first gap, but not the second gap. An etch is employed to provide trenches into the bulk semiconductor portion which have sidewall surfaces self aligned to sidewall surfaces of sacrificial spacer structures that are formed during this etch. A trench isolation structure is formed into each trench and thereafter a functional structure gate is formed surrounding each semiconductor fin of the first and second arrays of semiconductor fins.

In one aspect of the present application, a method of forming a non-planar semiconductor structure is provided. The method of the present application includes providing a first array of semiconductor fins on a first surface of a bulk semiconductor portion and a second array of semiconductor fins on a second surface of the bulk semiconductor portion, wherein each semiconductor fin of the first and second arrays is spaced apart by a first gap, and outermost semiconductor fins of the first and second arrays of semiconductor fins are spaced apart by a second gap that is wider than the first gap. A sacrificial material is deposited that completely fills each first gap with the sacrificial material, while not completely filling each second gap with the sacrificial material. A trench is then formed into a portion of the bulk semiconductor portion that is located under each second gap. Each trench that is formed has sidewall surfaces self aligned to sidewall surfaces of a sacrificial spacer structure that is formed in each second gap during the forming of the trench. A trench isolation structure is formed into each trench, and thereafter a functional gate structure is provided surrounding a portion of each semiconductor fin of the first and second arrays of semiconductor fins.

In another aspect of the present application, non-planar semiconductor structures are provided. In one embodiment, the semiconductor structure of the present application includes a first array of semiconductor fins located on a first semiconductor pedestal portion of a bulk semiconductor portion and a second array of semiconductor fins located on a second semiconductor pedestal portion of the bulk semiconductor portion. In accordance with the present application, each semiconductor fin of the first and second arrays is spaced apart by a first gap, and outermost semiconductor fins of the first and second arrays of semiconductor fins are spaced apart by a second gap that is wider than the first gap. A trench isolation structure is present between the first and second semiconductor pedestal portions. A functional gate structure straddles a portion of each semiconductor fin of the first and second arrays of semiconductor fins. Exposed portions of each semiconductor fin, not including the functional gate structure, are merged with a semiconductor material. The semiconductor material has sidewall surfaces that are vertically coincident to sidewall surfaces of the trench isolation structure.

In one embodiment, the semiconductor structure of the present application includes a first array of semiconductor fins located on a first semiconductor pedestal portion of a bulk semiconductor portion and a second array of semiconductor fins located on a second semiconductor pedestal portion of the bulk semiconductor portion. In accordance with the present application, each semiconductor fin of the first and second arrays is spaced apart by a first gap, and outermost semiconductor fins of the first and second arrays of semiconductor fins are spaced apart by a second gap that is wider than the first gap. A trench isolation structure is present between the first and second semiconductor pedestal portions. A functional gate structure straddles a portion of each semiconductor fin of the first and second arrays of semiconductor fins. A semiconductor material is present on each side of the function gate structure and is located on portions of each of the first and second semiconductor pedestal portions having a recessed opening and not including any semiconductor fin. A portion of each semiconductor material completely fills each recessed opening and each semiconductor material has sidewall surfaces that are vertically coincident to sidewall surfaces of the trench isolation structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application provides a method of forming a non-planar semiconductor structure in which improved strain benefit can be achieved by epitaxially growing a high quality semiconductor material on semiconductor pedestal portions of a bulk semiconductor substrate. The present application also provides a method of self aligning the trench isolation structures with various groups of semiconductor fins.

The method of the present application forms the trench isolation structures after the semiconductor fins are formed and self aligns the trench etch to the outermost semiconductor fin in an array of semiconductor fins. The method of the present application includes deposition of a sacrificial material that fills narrow gaps between semiconductor fins within a first array and a second array of semiconductor fins and not wider gaps that are present between the outermost semiconductor fins of each array of semiconductor fins. A subsequent etch removes the sacrificial material along the bottom of the wider gaps and forms a spacer structure at the edges of the wider gaps. The spacer structure is self aligned to the etch used in defining the trench isolation structures.

Figure 1:
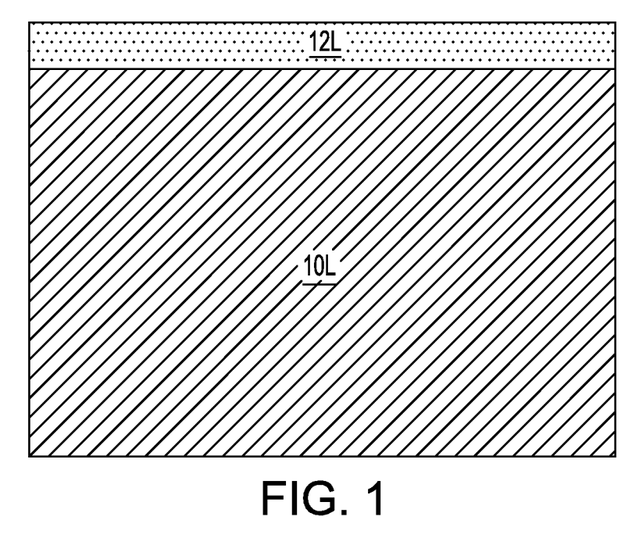
FIG. 1 is a cross sectional view of a first exemplary semiconductor structure including, a material stack of, from bottom to top, a bulk semiconductor substrate and a hard mask layer that can be employed in one embodiment of the present application.

Referring first to FIG. 1, there is illustrated a first exemplary semiconductor structure that can be employed in one embodiment of the present application. The first exemplary semiconductor structure shown in FIG. 1 includes a material stack of, from bottom to top, a bulk semiconductor substrate 10L and a hard mask layer 12L. The term "bulk" as used in conjunction with the phrase "semiconductor substrate" denotes that the entire substrate is comprised of at least one semiconductor material.

In one embodiment of the present application, the bulk semiconductor substrate 10L can be comprised of a single semiconductor material including, but not limited to, Si, Ge, SiGe, SiC, SiGeC, and III/V compound semiconductors such as, for example, InAs, GaAs, and InP. In another embodiment, the bulk semiconductor substrate 10L can be comprised of two or more of the aforementioned semiconductor materials.

In one embodiment, at least a topmost surface of the bulk semiconductor substrate 10L can be comprised of a single crystalline semiconductor material, such as, for example, single crystalline silicon or single crystalline germanium. In other embodiments, at least the topmost surface of the bulk semiconductor substrate 10L can be comprised of a polycrystalline or an amorphous semiconductor material. The crystal orientation of the bulk semiconductor substrate 10L may be {100}, {110}, or {111}. Other crystallographic orientations besides those specifically mentioned can also be used in the present application.

The hard mask layer 12L that is present on a topmost surface of the bulk semiconductor substrate 10L is a contiguous layer that covers the entirety of the topmost surface of the bulk semiconductor substrate 10L. The hard mask layer 12L that is employed in the present application may include a semiconductor oxide, a semiconductor nitride and/or a semiconductor oxynitride. In one embodiment, the hard mask material that can be used in providing the hard mask layer 12L can be comprised of silicon dioxide. In another embodiment, the hard mask material that can be used in providing the hard mask layer 12L can be comprised of silicon nitride. In yet another embodiment, the hard mask material that can be used in providing the hard mask layer 12L can be a stack comprised of, in any order, silicon dioxide and silicon nitride.

In some embodiments, the hard mask material that can be used in providing the hard mask layer 12L can be formed by a deposition process such as, for example, chemical vapor deposition (CVD) and plasma enhanced chemical vapor deposition (PECVD). In other embodiments, the hard mask material that can be used in providing the hard mask layer 12L can be formed by a thermal process such as, for example, thermal oxidation and/or thermal nitridation. In yet other embodiments, the hard mask material that can be used in providing the hard mask layer 12L can be formed by a combination of a deposition process and a thermal process. The thickness of the hard mask material that can be used in providing the hard mask layer 12L can range from 2 nm to 100 nm, with a thickness from 20 nm to 50 nm being more typical.

Figure 2:
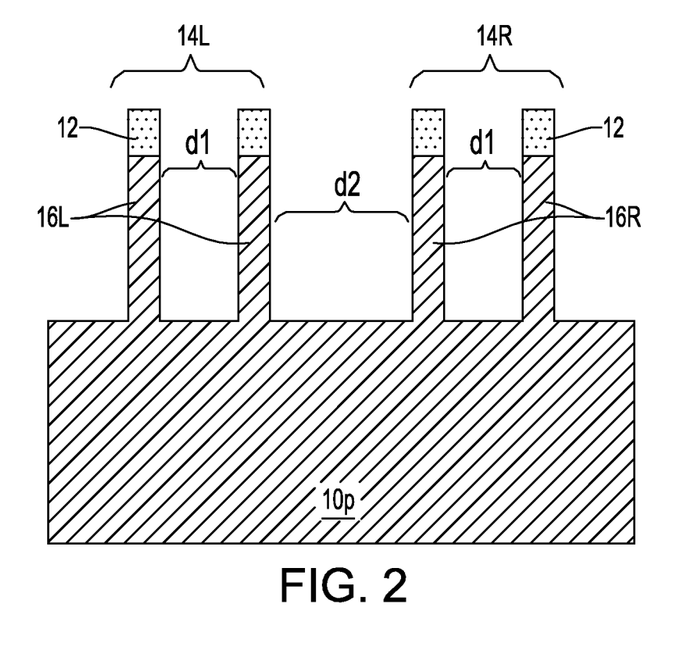
FIG. 2 is a cross sectional view of the first exemplary semiconductor structure of FIG. 1 after formation of a first array of semiconductor fins and a second array of semiconductor fins, wherein each semiconductor fin of the first array and second array is separated by a first distance, and wherein the outermost semiconductor fin of the first array that is nearest the outermost semiconductor fin of the second array is separated from the nearest outermost semiconductor fin of the second array by a second distance which is greater than the first distance.

Referring now FIG. 2, there is illustrated the first exemplary semiconductor structure of FIG. 1 after formation of a first array of semiconductor fins 14R and a second array of semiconductor fins 14L. The first array of semiconductor fins 14L includes a plurality of semiconductor fins 16L which extend upwards from a first surface of a remaining portion of the bulk semiconductor substrate 10L. The second array of semiconductor fins 14R includes a plurality of semiconductor fins 16R which extend upwards from a second surface of a remaining portion of the bulk semiconductor substrate 10L. The remaining portion of the bulk semiconductor substrate is hereinafter referred to as a "bulk semiconductor portion 10p".

Each semiconductor fin 16L of the first array of semiconductor fins 14L and each semiconductor fin 16R of the second array of semiconductor fins 14R comprise a first semiconductor material which is the same as that of the bulk semiconductor substrate 10L. In one example, each semiconductor fin 16L of the first array of semiconductor fins 14L and each semiconductor fin 16R of the second array of semiconductor fins 14R comprise single crystalline silicon.

As used herein, a "fin" refers to a contiguous structure including a semiconductor material and including a pair of vertical sidewalls that are parallel to each other. As used herein, a surface is "vertical" if there exists a vertical plane from which the surface does not deviate by more than three times the root mean square roughness of the surface.

Each semiconductor fin 16L of the first array of semiconductor fins 14L and each semiconductor fin 16R of the second array of semiconductor fins 14R have a same height and a same width. In one embodiment of the present application, each semiconductor fin 16L of the first array of semiconductor fins 14L and each semiconductor fin 16R of the second array of semiconductor fins 14R has a height from 10 nm to 100 nm, and a width from 4 nm to 30 nm. In another embodiment of the present application, each semiconductor fin 16L of the first array of semiconductor fins 14L and each semiconductor fin 16R of the second array of semiconductor fins 14R has a height from 15 nm to 50 nm, and a width from 5 nm to 12 nm. Also, each semiconductor fin 16L of the first array of semiconductor fins 14L and each semiconductor fin 16R of the second array of semiconductor fins 14R are oriented parallel to one another.

The number of semiconductor fins 16L within the first array of semiconductor fins 14L may vary and is typically a number from 2 to 8. The number of semiconductor fins 16R within the second array of semiconductor fins 14R may also vary and is typically from 2 to 8. In one embodiment, the number of semiconductor fins 16L within the first array of semiconductor fins 14L is equal to the number of semiconductor fins 16R within the second array of semiconductor fins 14R. In another embodiment, the number of semiconductor fins 16L within the first array of semiconductor fins 14L is less than the number of semiconductor fins 16R within the second array of semiconductor fins 14R. In yet a further embodiment, the number of semiconductor fins 16L within the first array of semiconductor fins 14L is greater than the number of semiconductor fins 16R within the second array of semiconductor fins 14R.

As is shown in FIG. 2, each semiconductor fin 16L of the first array of semiconductor fins 14L and each semiconductor fin 16R of the second array of semiconductor fins 14R are capped with a remaining portion of the hard mask layer. The remaining portion of the hard mask layer that is present on the topmost surface of each semiconductor fin 16L of the first array of semiconductor fins 14L and each semiconductor fin 16R of the second array of semiconductor fins 14R can be referred to hereinafter as hard mask cap 12.

In accordance with the present application, each semiconductor fin 16L of the first array of semiconductor fins 14L and each semiconductor fin 16R of the second array of semiconductor fins 14R are separated by a first distance d1. In one embodiment of the present application, d1 can be a value ranging from 10 nm to 50 nm. Other values for d1 that are lesser than or greater than the aforementioned range can also be used for d1.

In further accordance with the present application, the outermost semiconductor fin of the first array of semiconductor fins 14L that is nearest the outermost semiconductor fin of the second array of semiconductor fins 14R is separated from the nearest outermost semiconductor fin of the second array by a second distance d2 which is greater than the first distance d1. In one embodiment of the present application, d2 can be a value ranging from 30 nm to 200 nm. Other values for d2 that are lesser than or greater than the aforementioned range can also be used for d2 so long as d2 is greater than d1.

The first distance d1 between each semiconductor fin of the first array and second array of semiconductor fins 14L, 14R provides a first gap, while the second distance d2 between the outermost semiconductor fin of the first array 14L and the nearest outermost semiconductor fin of the second array 14R provides a second gap. In accordance with the present application, the second gap is greater than the first gap.

The first exemplary semiconductor structure shown in FIG. 2 can be formed by a sidewall image transfer (SIT) process. The SIT process includes forming a contiguous mandrel material layer (not shown) on the topmost surface of the hard mask layer 12L. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of the hard mask layer 12L.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of dielectric metal oxides that can be used as the dielectric spacer material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. Examples of deposition processes that can be used in providing the dielectric spacer material include, for example, chemical vapor deposition (CVD), plasma enhanced chemical vapor deposition (PECVD), and atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each semiconductor fin and as such the width of each dielectric spacer is within the width mentioned above for each semiconductor fin.

After formation of the dielectric spacers, the SIT process continues by removing each mandrel structure. Each mandrel structure can be removed by an etching process that is selective for removing the mandrel material as compared to the material of the dielectric spacers and hard mask layer 12L. Following the mandrel structure removal, the SIT process continues by transferring the patterned provided by the dielectric spacers into the hard mask layer 12L and then into the bulk semiconductor substrate 10L. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In other embodiments of the present application, the patterning of the material stack can be performed utilizing lithography and etching. Lithography includes forming a photoresist material on the topmost surface of the hard mask layer 12L, exposing the photoresist material to a desired pattern of radiation, and developing the exposed photoresist material utilizing a conventional resist developer. One or more etching steps may be used to transfer the pattern into the material stack providing the structure shown in FIG. 2. The photoresist is removed after pattern transfer utilizing a conventional resist stripping process such as, for example, ashing.

Figure 3:
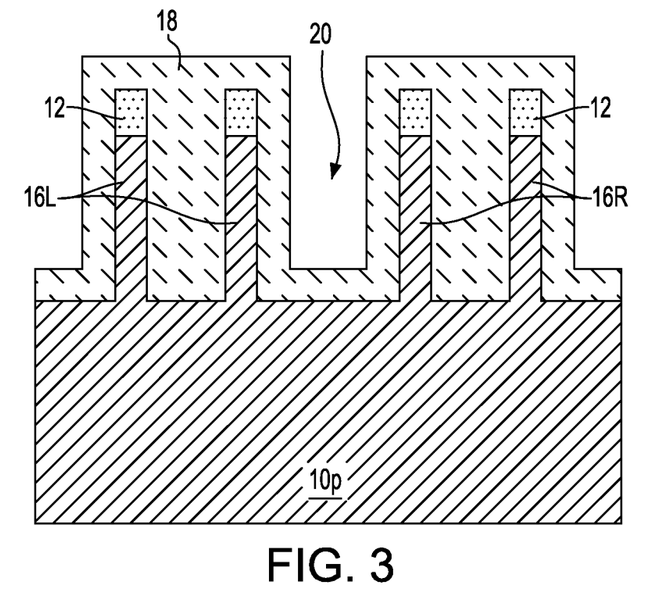
FIG. 3 is a cross sectional view of the first exemplary semiconductor structure of FIG. 2 after deposition of a sacrificial material, wherein the sacrificial material completely fills a first gap defined by the first distance between each semiconductor fin of the first array and second array, while not completely filling a second gap defined by the second distance between the outermost semiconductor fin of the first array and the nearest outermost semiconductor fin of the second array.

Referring now to FIG. 3, there is illustrated the first exemplary semiconductor structure of FIG. 2 after deposition of a sacrificial material 18. In accordance with the present application, the sacrificial material 18 completely fills the first gap defined by the first distance d1 between each semiconductor fin of the first array and second array, while not completely filling the second gap defined by the second distance d2 between the outermost semiconductor fin of the first array and the nearest outermost semiconductor fin of the second array. Thus, and after formation of the sacrificial material, the first gap is completely filled with the sacrificial material, while an opening 20 remains in the second gap. The opening 20 that remains in the second gap will be used in a subsequent step to define trenches within the bulk semiconductor portion 10p which trenches will be further processed into trench isolation structures.

The sacrificial material 18 that can be employed in the present application includes a hard mask material that differs from the hard mask material that provides the hard mask layer 12L and the hard mask caps 12. In one example, and when the hard mask layer 12L is comprised of silicon dioxide, the sacrificial material 18 may be comprised of silicon nitride or silicon oxynitride. The sacrificial material 18 can be formed by a deposition process. Examples of deposition processes that can be used in forming the sacrificial material 18 include chemical vapor deposition and atomic layer deposition.

Figure 4:
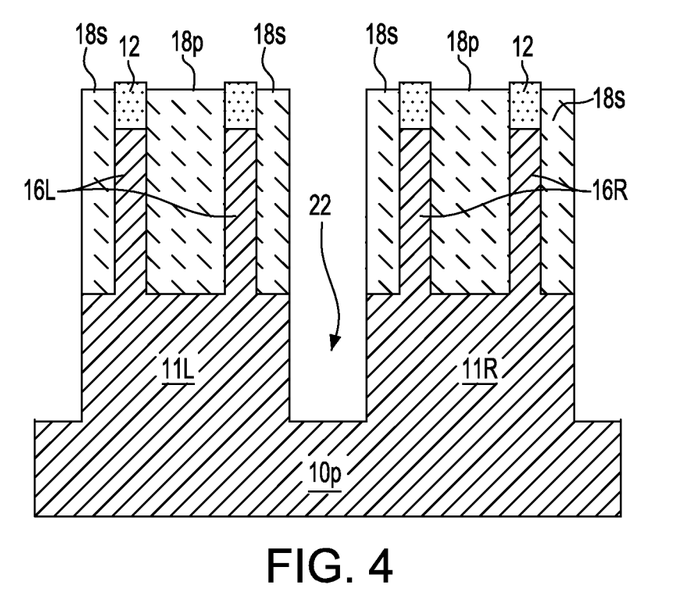
FIG. 4 is a cross sectional view of the first exemplary semiconductor structure of FIG. 3 after formation of trenches within the bulk semiconductor substrate.

Referring now to FIG. 4, there is illustrated the first exemplary semiconductor structure of FIG. 3 after formation of trenches 22 within the bulk semiconductor substrate portion 10L. The trenches 22 define a first semiconductor pedestal portion 11L in which the first array of semiconductor fins 14L are located on, and a second semiconductor pedestal portion 11R in which the second array of semiconductor fins 14R are located on.

The first and second semiconductor pedestal portions 11L, 11R each comprise a same semiconductor as the bulk semiconductor substrate 10L. The first and second semiconductor pedestal portions 11L, 11R each comprise vertical sidewall surfaces that extend downward to a remaining portion of the bulk semiconductor portion 10p.

Each trench 22 that is formed has a bottommost surface that exposes a sub-surface of the bulk semiconductor portion 10p. Each trench 22 that is formed has sidewall surfaces that are aligned with the vertical sidewalls of the sacrificial material within the second gap that is defined by distance d2.

Each trench 22 can be formed by utilizing one or more etching processes such as, for example, reactive ion etching. During this step that defines trenches 22 within the bulk semiconductor portion 10p, horizontal surfaces of the sacrificial material 18 that are located at the bottom of the opening 20 in the second gap are etched at a faster rate than the vertical surfaces of the sacrificial material. Thus, this step not only creates trenches 22, but also exposes at least topmost surface of each hard mask cap 12. The sacrificial material that remains on the sidewall surfaces of the outermost semiconductor fins of the first and second arrays of semiconductor fins after this etch and in the second gap defined by d2 may be referred to herein as a sacrificial spacer structure 18s, while the sacrificial material that remains after this etch and in the gap defined by d1 may be referred to herein as a sacrificial material plug 18p. In some embodiments, a first reactive ion etch can be used to remove an exposed horizontal portion of the sacrificial material with the second gap creating the sacrificial spacer structures 18s. This first etch exposes an underlying portion of the bulk semiconductor portion 10p. A second etch is then used to form the trenches 22 in the bulk semiconductor portion 10p by removing semiconductor material within the portion of the bulk semiconductor portion 10p that was exposed by the first etch.

Figure 5:
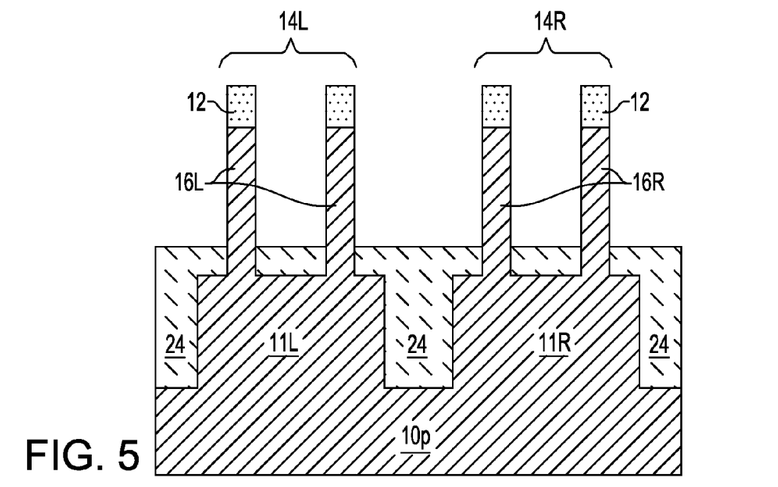
FIG. 5 is a cross sectional view of the first exemplary semiconductor structure of FIG. 4 after formation of trench isolation structures within each of the trenches.

Referring now FIG. 5, there is illustrated the first exemplary semiconductor structure of FIG. 4 after formation of trench isolation structures 24 within each of the trenches 22. Trench isolation structures 24 can be formed by first removing each sacrificial spacer structure 18s, and each sacrificial material plug 18p, and then filling each trench 22 with a trench dielectric material such as, for example, an oxide. Optionally, a liner may be formed in each trench 22 prior to trench fill, a densification step may be performed after the trench fill and a planarization process may follow the trench fill as well. In some embodiments of the present application, a recess etch may be performed to ensure that a majority of sidewall surfaces (greater than 50% exposure) of each semiconductor fin 16L within the first array of semiconductor fins 14L and a majority of sidewall surfaces (greater than 50% exposure) of each semiconductor fin 16R within the second array of semiconductor fins 14R are exposed. In some embodiments and as shown in FIG. 5, a portion of the trench dielectric material that is used in forming the trench isolation structures extends above the topmost surface of the first and second semiconductor pedestal portions 11L, 11R of the bulk semiconductor portion 10p. In some embodiments (not shown), the topmost surface of each trench isolation structure 24 is coplanar with a topmost surface of each the first and second semiconductor pedestal portions 11L, 11R of the bulk semiconductor portion 10p.

Figure 6A:
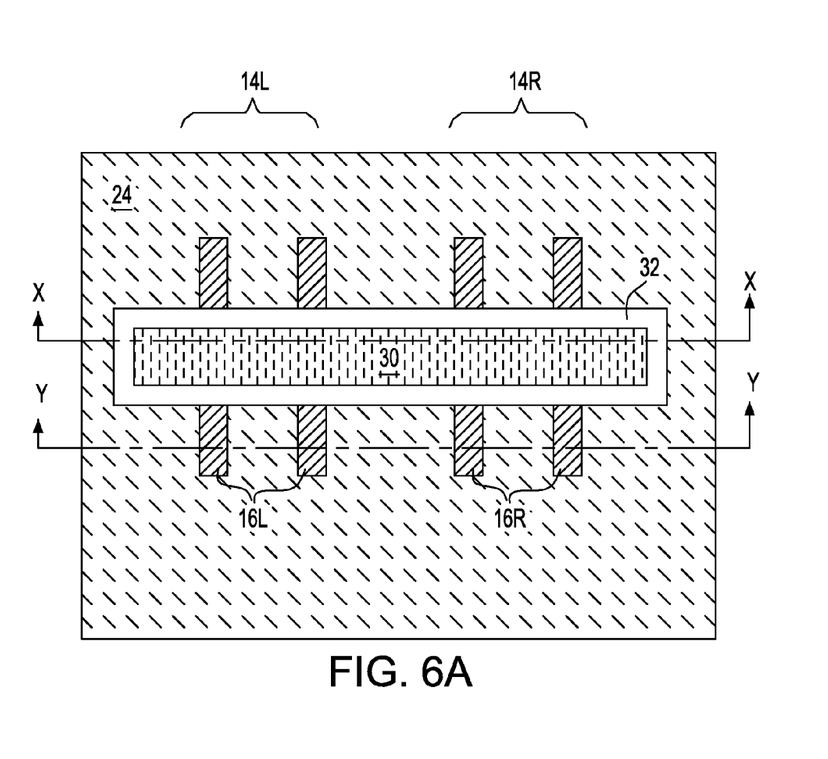
FIG. 6A is a top down view of the first exemplary semiconductor structure of FIG. 5 after formation of a functional gate structure and dielectric spacers.
Figure 6B:
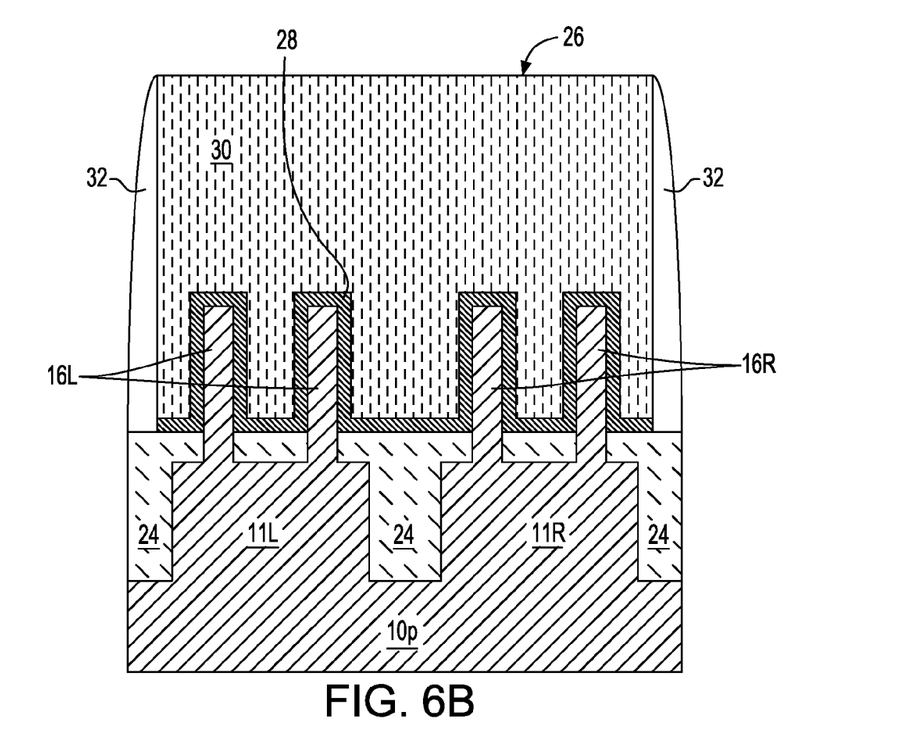
FIG. 6B is cross sectional view of the first exemplary semiconductor of FIG. 6A through vertical plane X-X.

Referring now to FIGS. 6A-6B, there is illustrated the first exemplary semiconductor structure of FIG. 5 after formation of a functional gate structure 26 and dielectric spacers 32. The term "functional gate structure" is used throughout the present application as a permanent gate structure used to control output current (i.e., flow of carriers in the channel) of a semiconducting device through electrical or magnetic fields. The functional gate structure 26 includes a gate material stack, of from bottom to top, a gate dielectric material portion 28 and a gate conductor material portion 30. In some embodiments, and as shown, the bottommost portion of the functional gate structure 26, i.e., the bottommost surface of the gate dielectric material portion 28, directly contacts a topmost surface of the trench dielectric material that was formed outside of the trenches 22.

In some embodiments, and as shown in the drawings, each hard mask cap 12 can be removed from each semiconductor fin 16L of the first array of semiconductor fins 14L and from each semiconductor fin 16R of the second array of semiconductor fins 14R. The removal of each hard mask cap 12 exposes a topmost surface of each semiconductor fin 16L of the first array of semiconductor fins 14L and each semiconductor fin 16R of the second array of semiconductor fins 14R. The removal of each hard mask cap 12 can be performed by an etch or a planarization process. In embodiments in which the hard mask cap 12 is removed from each semiconductor fin 16L of the first array of semiconductor fins 14L and each semiconductor fin 16R of the second array of semiconductor fins 14R, the gate dielectric material portion 28 is directly contacting three surfaces, i.e., sidewall surfaces and the topmost surface, of each semiconductor fin 16L of the first array of semiconductor fins 14L and each semiconductor fin 16R of the second array of semiconductor fins 14R.

In another embodiment of the present application (not shown), the hard mask cap 12 remains on each semiconductor fin 16L of the first array of semiconductor fins 14L and each semiconductor fin 16R of the second array of semiconductor fins 14R. In such an embodiment, the gate dielectric material portion 28 would be directly contacting only the sidewall surfaces of each semiconductor fin 16L of the first array of semiconductor fins 14L and each semiconductor fin 16R of the second array of semiconductor fins 14R.

In still a further embodiment of the present application (also not shown), the hard mask caps 12 may be removed from each semiconductor fin in either the first or second array of semiconductor fins, while the hard mask caps 12 may remain on each semiconductor fin in the other of the first of second array of semiconductor fins. In such an embodiment, the gate dielectric material portion that is present in the array of semiconductor fins in which the hard mask caps were removed, would be present on three surfaces of each semiconductor fin, while in the array in which the hard mask caps remain, the gate dielectric material portion would be present only on the two sidewall surfaces of each semiconductor fin.

The gate dielectric material that provides the gate dielectric material portion 28 can be an oxide, nitride, and/or oxynitride. In one example, the gate dielectric material that provides the gate dielectric material portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric material portion 28.

The gate dielectric material used in providing the gate dielectric material portion 28 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material portion 28. In some embodiments, the semiconductor fins of the first array of semiconductor fins may contain a functional gate structure comprising a first dielectric material portion, while the semiconductor fins of the second array of semiconductor fins may contain a functional gate structure comprising a second dielectric material portion which is different in terms of composition from the first dielectric material portion. When a different gate dielectric material is used for the gate dielectric material portions, block mask technology can be used. In one embodiment of the present application, the gate dielectric material used in providing the gate dielectric material portion 28 can have a thickness in a range from 1 nm to 10 nm. Other thicknesses that are lesser than or greater than the aforementioned thickness range can also be employed for the gate dielectric material.

The gate conductor portion 30 comprises a gate conductor material. The gate conductor material used in providing the gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion 30 may comprise an nFET gate metal. In other embodiments, the gate conductor material portion 30 may comprise a pFET gate metal.

The gate conductor material used in providing the gate conductor material portion 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed.

In some embodiments, the semiconductor fins of the first array of semiconductor fins may contain a functional gate structure comprising a first gate conductor material portion, while the semiconductor fins of the second array of semiconductor fins may contain a functional gate structure comprising a second gate conductor material portion which is different in terms of composition from the first gate conductor material portion. When a different gate conductor material is used for the gate conductor material portions, block mask technology can be used. In one embodiment, the gate conductor material used in providing the gate conductor portion 30 has a thickness from 1 nm to 100 nm. Other thicknesses that are lesser than or greater than the aforementioned thickness range can also be employed for the gate conductor material used in providing the gate conductor material portion 30.

In some embodiments and as shown, a single functional gate structure is formed. In other embodiments, a first functional gate structure is formed straddling each semiconductor fin 16L of the first array of semiconductor fins 14L, while a second functional gate structure is formed straddling each semiconductor fin 16R of the second array of semiconductor fins 14R.

The functional gate structure(s) may be formed by first depositing a gate stack comprising, from bottom to top, a gate dielectric material and a gate conductor material, and then patterning the gate stack by lithography end etching.

After functional gate structure 26 formation, dielectric spacers 32 are formed. The dielectric spacers 32 comprise a dielectric spacer material including, for example, one of the materials mentioned above for hard mask layer 12L. The dielectric spacers 32 can be formed by deposition of a dielectric spacer material, and then etching the dielectric spacer material.

In one embodiment and as shown, the base (i.e., bottommost surface) of each dielectric spacer 32 is present on a trench dielectric material that extends outside of each trench 22 and thus, the bottommost surface of each dielectric spacer 32 is located above the topmost surface of the first and second semiconductor pedestal portions 11L, 11R. In another embodiment (not shown), the base (i.e., bottommost surface) of each dielectric spacer 32 is present on a topmost surface of the trench isolation structure 24 that is coplanar with a topmost surface of the first and second semiconductor pedestal portions 11L, 11R. In such an embodiment, the bottommost surface of each dielectric spacer 32 is also coplanar with the topmost surface of the first and second semiconductor pedestal portions 11L, 11R.

A source region and a drain region, collectively referred hereinafter as "source/drain regions", (not shown) can be formed in portions of each semiconductor fin 16L of the first array of semiconductor fins 14L and each semiconductor fin 16R of the second array of semiconductor fins 14R, that are not covered by either the functional gate structure 26 or the dielectric spacer 32. In the present case, the source/drain regions would be formed in an exposed portion of each semiconductor fin 16L of the first array of semiconductor fins 14L and an exposed portion of each semiconductor fin 16R of the second array of semiconductor fins 14R which would come into and out of the plane of the drawing that illustrates FIG. 5. Notably the source/drain regions are formed in exposed portions of the fins on either side of the functional gate structure. The source/drain regions can be formed by introducing a dopant into the exposed portions of each semiconductor fin 16L of the first array of semiconductor fins 14L and each semiconductor fin 16R of the second array of semiconductor fins 14R, which are not covered by either the functional gate structure 26 or the dielectric spacer 32. The dopant can be n-type or p-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant may be introduced into the exposed portions of each semiconductor fin 16L of the first array of semiconductor fins 14L and each semiconductor fin 16R of the second array of semiconductor fins 14R, by ion implantation, plasma doping or gas phase doping. The concentration of dopants used in providing the source/drain regions can range from 5e18 atoms/cm$^3$ to 1.5e21 atoms/cm$^3$. In some embodiments, the formation of source/drain regions can be omitted.

Figure 7:
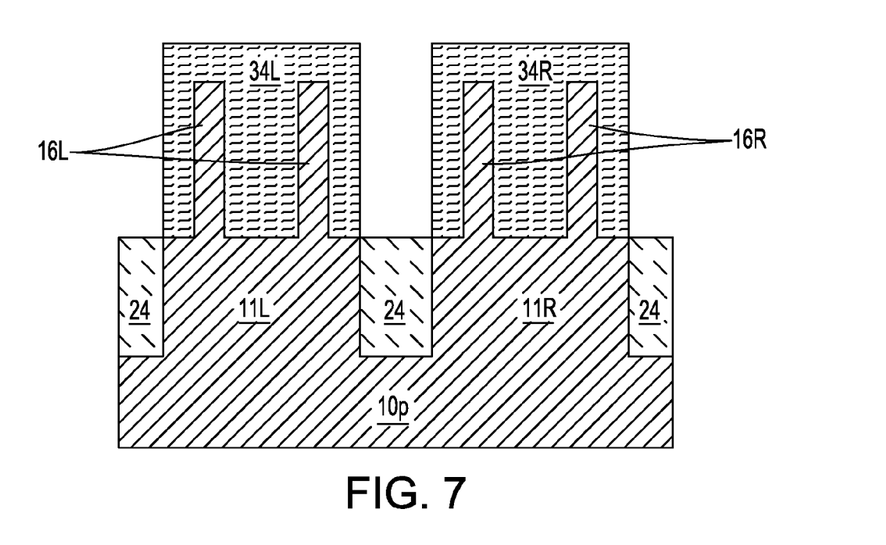
FIG. 7 is a cross sectional view through vertical plane Y-Y showing the first exemplary semiconductor structure of FIG. 6A after epitaxial growth of a semiconductor material in accordance with an embodiment of the present application.

Referring now to FIG. 7, there is illustrated the first exemplary semiconductor structure of FIGS. 6A-6B after epitaxially growing a semiconductor material 34L, 34R and in accordance with an embodiment of the present application. The view shown in FIG. 7 is a cross sectional view through vertical plane Y-Y showing only one of the source region or drain region of the structure. Semiconductor material 34L completely surrounds exposed portions of each semiconductor fin 16L of the first array of semiconductor fins 14L that are not covered by either the functional gate structure 26 or the dielectric spacer 32, while semiconductor material 34R completely surrounds exposed portions of each semiconductor fin 16R of the second array of semiconductor fins 14R not covered by either the functional gate structure 26 or the dielectric spacer 32. Thus, and in this embodiment of the present application, the semiconductor material 34L merges the semiconductor fins 16L of the first array of semiconductor fins 14L, and the semiconductor material 34R merges the semiconductor fins 16R of the second array of semiconductor fins 14R. Although not shown in the drawing figure, a sidewall surface of each semiconductor material 34L, 34R directly contacts a sidewall surface of dielectric spacer 32.

As shown, semiconductor material 34L has a bottommost surface that is present on the first semiconductor pedestal portion 11L of the bulk semiconductor portion 10p, while semiconductor material 34R has a bottommost surface that is present on the second semiconductor pedestal portion 11R of the bulk semiconductor portion 10p. The topmost surface of semiconductor material 34L is located above the topmost surface of each semiconductor fin 16L of the first array of semiconductor fins 14L, while the topmost surface of semiconductor material 34R is located above the topmost surface of each semiconductor fin 16R of the second array of semiconductor fins 14R. Semiconductor material 34L, 34R has sidewall surfaces that extend beyond the sidewall surfaces of the outermost semiconductor fins in the first and second array of semiconductor fins 14L, 14R. The sidewall surfaces of semiconductor material 34L, 34R are vertically coincident to the outermost edges, i.e., sidewalls, of each of the semiconductor pedestal portions 11L, 11R and also the trench isolation structures 24.

The epitaxial growth process includes an epitaxial pre-clean that removes the trench dielectric material that extends outside the trenches 22. This pre-clean exposes the topmost surface of the semiconductor pedestal portions 11L, 11R. The epi pre-clean is performed by an aqueous etch containing hydrofluoric acid, a dry etch such as chemical oxide removal (COR), or a combination of both. The epi pre-preclean can be performed ex-situ (separate cleaning tool from epi tool) or in-situ (preclean and epi are in the same equipment platform). Following the epi pre-clean, the semiconductor material 34L, 34R is epitaxially grown (or deposited) bottom up. By "bottom-up" it is meant that initial epitaxial growth of the semiconductor material 34L, 34R occurs vertically upward from a semiconductor material, i.e., the semiconductor pedestal portions 11L, 11R. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, semiconductor material 34L, 34R has an epitaxial relationship, i.e., same crystal orientation, with the underlying semiconductor material, i.e., each semiconductor pedestal portion 11L, 11R.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming semiconductor material 34L, 34R include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming semiconductor material 34L, 34R typically ranges from 550° C. to 900° C. Although higher temperature typically results in faster deposition, the faster deposition may result in crystal defects and film cracking.

The semiconductor material 34L, 34R can be comprised of one of the semiconductor materials mentioned above for the bulk semiconductor substrate 10L. In one embodiment, the semiconductor material 34L, 34R comprises a same semiconductor material as the bulk semiconductor substrate 10L. In such an embodiment, no material interface would exist between the semiconductor fins 16L, 16R and the semiconductor material 34L, 34R. In another embodiment, the semiconductor material 34L, 34R comprises a different semiconductor material as the bulk semiconductor substrate 10L. In such an embodiment, a material interface would exist between the semiconductor fins 16L, 16R and the semiconductor material 34L, 34R. Also, in such an embodiment, a strain can be induced upon each semiconductor fin that is located beneath the functional gate structure 26. Examples of semiconductor materials that can be used in providing the semiconductor material 34L, 34R include Si, Ge, and SiGe.

A number of different source gases may be used for the deposition of the semiconductor material 34L, 34R. In some embodiments, the source gas for the deposition of the semiconductor material 34L, 34R includes a silicon containing gas source, a germanium containing gas source, or a combination thereof. For example, an epitaxial Si layer may be deposited from a silicon gas source that is selected from silane, disilane, trisilane, tetrasilane, hexachlorodisilane, tetrachlorosilane, dichlorosilane, trichlorosilane, methylsilane, dimethylsilane, ethylsilane, methylsilane, dimethyldisilane, hexamethyldisilane and combinations thereof. An epitaxial germanium layer can be deposited from a germanium gas source that is selected from germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, dopants (i.e., n-type or p-type as mentioned above) can be introduced into the semiconductor material 34L, 34R during the epitaxial growth process. In other embodiments, dopants (i.e., n-type or p-type as mentioned above) can be introduced into the semiconductor material 34L, 34R after the epitaxial growth process by ion implantation or gas phase doping. In either embodiment, the semiconductor material 34L, 34R can contain dopant atoms therein.

Figure 8:
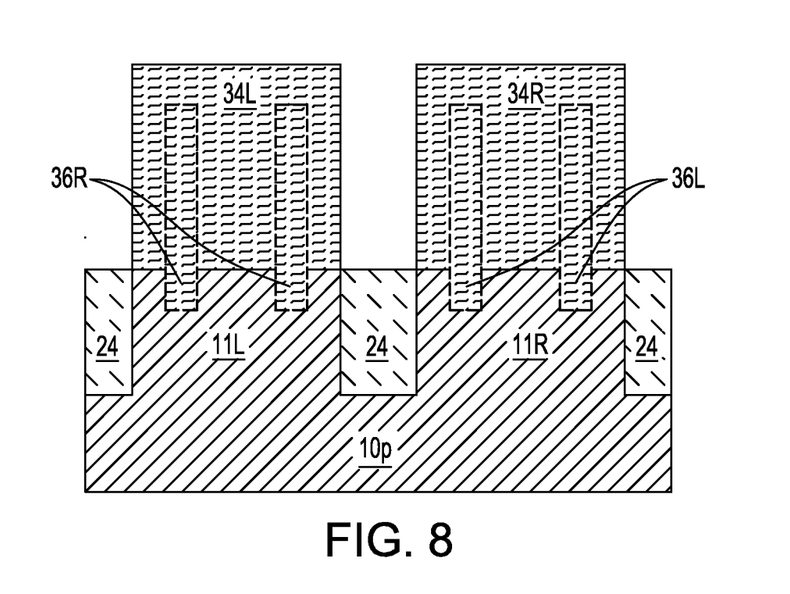
FIG. 8 is a cross sectional view through vertical plane Y-Y showing the first exemplary semiconductor structure of FIG. 6A after removing exposed semiconductor fins of the first and second arrays, creating first openings within a semiconductor portion of the bulk semiconductor substrate and second openings within another semiconductor portion of the bulk semiconductor substrate, and epitaxially growing a semiconductor material in accordance with an embodiment of the present application.

Referring now to FIG. 8, there is illustrated the first exemplary semiconductor structure of FIGS. 6A-6B after creating first openings 36L within the first semiconductor pedestal portion 11L and directly beneath exposed portions of each semiconductor fin 16L of the first array of semiconductor fins 14L and second openings 36R within the second semiconductor pedestal portion 11R and directly beneath exposed portions of each semiconductor fin 16R of the second array of semiconductor fins 14R and epitaxial growth of a semiconductor material 34L, 34R. The view shown in FIG. 8 is a cross sectional view through vertical plane Y-Y showing only one of the source region or drain region of the structure. Phantoms lines are present showing the position of each semiconductor fin only for reference purposes.

The structure shown in FIG. 8 is first created by removing exposed portions of each semiconductor fin 16L of the first array of semiconductor fins 14L and exposed portions of each semiconductor fin 16R of the second array of semiconductor fins 14R that are not covered by the functional gate structure 26 or the dielectric spacer 32. The removal of the exposed semiconductor fins that are not covered by either the functional gate structure 26 or the dielectric spacer 32 can be performed utilizing an etching process such as, for example, reactive ion etching. During the etch, portions of the first semiconductor pedestal portions 11L, 11R are also etched forming the first openings 36L within semiconductor pedestal portion 11R and second openings 36R within the second semiconductor pedestal portion 11R. In this embodiment, semiconductor material 34L, 34R can function as the source/drain regions of the device.

After performing this etch, the semiconductor material 34L, 34R is formed by epitaxial as described above. In this embodiment, a bottom portion of semiconductor material 34L fills each of the first openings 36L, and a bottom portion of semiconductor material 34R fills each of the second openings 36R.

In some embodiments, dopants (i.e., n-type or p-type as mentioned above) can be introduced into the semiconductor material 34L, 34R during the epitaxial growth process. In other embodiments, dopants (i.e., n-type or p-type as mentioned above) can be introduced into the semiconductor material 34L, 34R after the epitaxial growth process by ion implantation or gas phase doping. In either embodiment, the semiconductor material 34L, 34R can contain dopant atoms therein.

Figure 9:
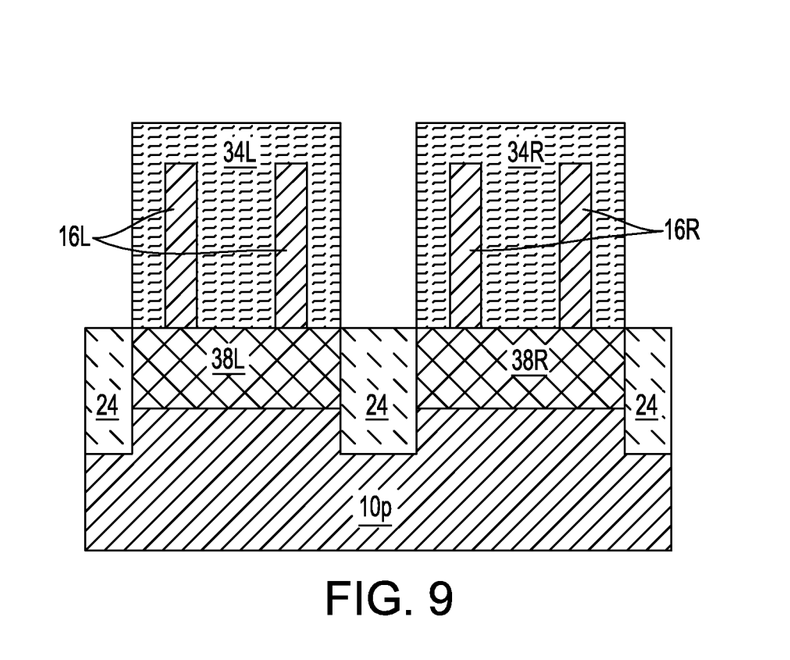
FIG. 9 is a cross sectional view of a second exemplary semiconductor structure of the present application including a punch-through stop doping region as formed utilizing the embodiment shown in FIGS. 1-7.

Referring now to FIG. 9, there is illustrated a second exemplary semiconductor structure of the present application including a punch-through stop doping region 38L, 38R as formed utilizing the embodiment shown in FIGS. 1-7. The punch-through stop doping region 38L, 38R can be formed utilizing a doping process such as, for example, ion implantation or gas phase doping in which n-type or p-type dopants are introduced into a portion of the bulk semiconductor substrate. The doping may be performed prior to fin formation or after fin formation.

Figure 10:
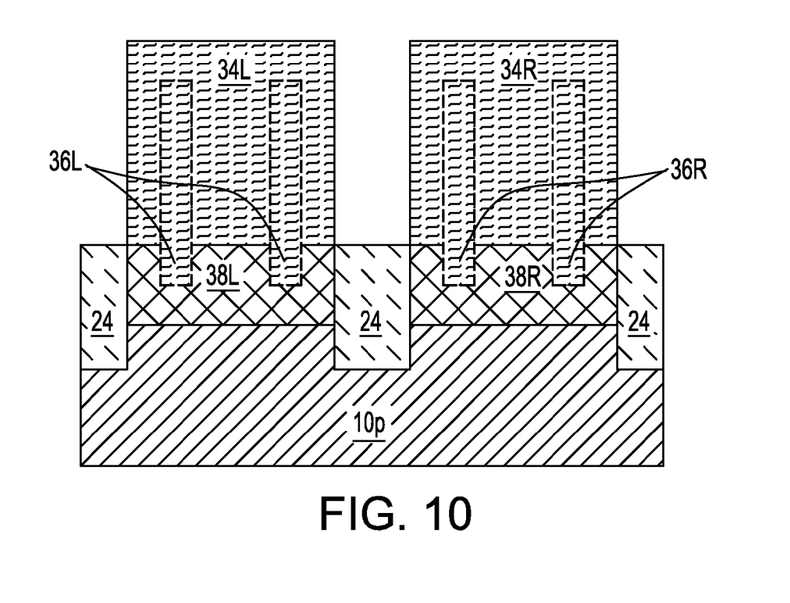
FIG. 10 is a cross sectional view of a third exemplary semiconductor structure of the present application including a punch-through stop doping region as formed utilizing the embodiment shown in FIGS. 1-6A-6B and 8.

Referring now to FIG. 10, there is illustrated a third exemplary semiconductor structure of the present application including a punch-through stop doping region 38L, 38R as formed utilizing the embodiment shown in FIGS. 1-6A-6B and 8. The punch-through stop doping region 38L, 38R can be formed utilizing a doping process such as, for example, ion implantation or gas phase doping in which n-type or p-type dopants are introduced into a portion of the bulk semiconductor substrate. The doping may be performed prior to fin formation or after fin formation.

Figure 11:
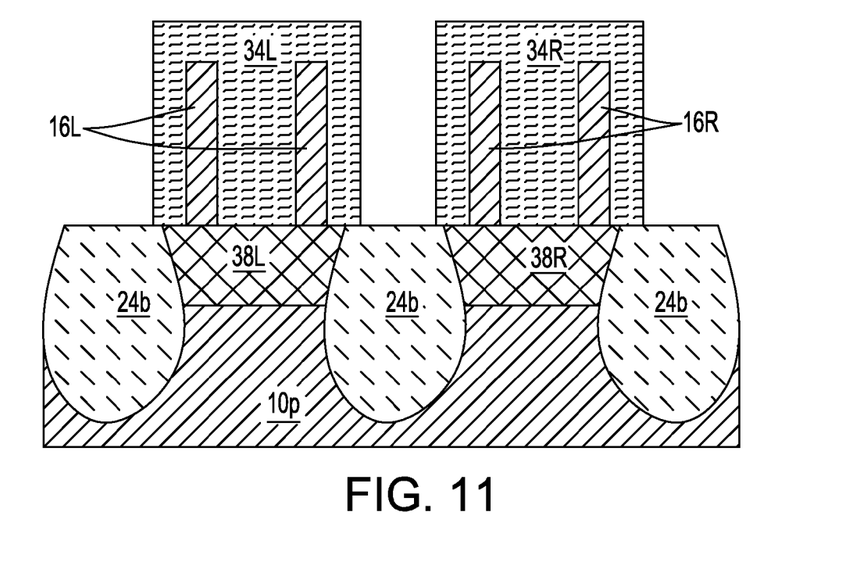
FIG. 11 is a cross sectional view of a fourth exemplary semiconductor structure of the present application including bottle shaped trench isolation structures.

Referring now to FIG. 11, there is illustrated a fourth exemplary semiconductor structure of the present application including bottle shaped trench isolation structures 24b. Each bottle shaped trench isolation structure has an upper region (i.e., neck region) having a first width and a lower region (i.e., base region) having a second width that is greater than the first width. The bottle shaped trench isolation structures 24b are formed by first providing the structure shown in FIG. 4. The etch used in forming the shown of FIG. 4 is an anisotropic etch. In the illustrated embodiment, the punch-through stop doping region 38L, 38R is shown to be present. After providing the structure shown in FIG. 4, an isotropic etch can be used to create bottle shaped trenches. The bottle shaped trenches are then filled with a trench dielectric material as mentioned above. Processing as described above in connection with FIGS. 6A-6B and 7 is then performed providing the structure that is shown in FIG. 11.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A method of forming a semiconductor structure comprising:
    providing a first array of semiconductor fins on a first surface of a bulk semiconductor portion and a second array of semiconductor fins on a second surface of said bulk semiconductor portion, wherein each semiconductor fin of said first and second arrays is spaced apart by a first gap, and outermost semiconductor fins of said first and second arrays of semiconductor fins are spaced apart by a second gap that is wider than said first gap;
    depositing a sacrificial material completely filling each first gap with said sacrificial material, while not completely filling each second gap with said sacrificial material;
    forming a trench into a portion of said bulk semiconductor portion that is located under each second gap, wherein each trench has sidewall surfaces self aligned to sidewall surfaces of a sacrificial spacer structure that is formed in each second gap during said forming said trench;
    forming a trench isolation structure into each trench; and
    providing a functional gate structure surrounding a portion of each semiconductor fin of said first and second arrays of semiconductor fins.

2. The method of claim 1, wherein said providing said first array of semiconductor fins on said first surface of said bulk semiconductor portion and said second array of semiconductor fins on said second surface of said bulk semiconductor portion comprises:
    providing a material stack comprising, from bottom to top, a bulk semiconductor substrate and a hard mask layer; and
    patterning said material stack utilizing a sidewall image transfer process.

3. The method of claim 1, wherein an opening remains in each second gap after depositing said sacrificial material.

4. The method of claim 3, wherein said forming said trench comprises:
    first removing a horizontal portion of said sacrificial material exposed by said opening in said second gap to define said sacrificial spacer structure in said second gap and to expose an underlying portion of said bulk semiconductor portion; and
    second removing semiconductor material at said exposed underlying portion of said bulk semiconductor substrate.

5. The method of claim 4, wherein said second removing forms a first semiconductor pedestal portion containing said semiconductor fins of said first array of semiconductor fins, and a second semiconductor pedestal portion containing said semiconductor fins of said second array of semiconductor fins, wherein said first semiconductor pedestal portion is separated from said second semiconductor pedestal portion by said trench.

6. The method of claim 1, wherein said forming said trench isolation structure into each trench comprises filling each trench with a trench dielectric material.

7. The method of claim 1, further comprising removing said sacrificial spacer structure in said second gap and a remaining portion of said sacrificial material in said first gap to expose each semiconductor fin within the first and second arrays of semiconductor fins.

8. The method of claim 7, wherein said forming said functional gate structure comprises:
    first depositing a gate dielectric material;
    second depositing a gate conductor material; and
    patterning said gate dielectric material and said gate conductor material.

9. The method of claim 8, further comprising forming dielectric spacers on sidewall surfaces of said functional gate structure after said patterning of said gate dielectric material and said gate conductor material.

10. The method of claim 9, further comprising merging exposed portions of each semiconductor fin of the first array of semiconductor fins, and exposed portions of each semiconductor fin of said second array of semiconductor fins that are not covered by said functional gate structure or said dielectric spacer.

11. The method of claim 10, wherein said merging comprises:
    performing an epitaxial pre-clean to expose a topmost surface of a semiconductor pedestal portion located beneath each semiconductor fin of the first and second arrays of semiconductor fins; and
    epitaxially growing said semiconductor material from said topmost surface of each semiconductor pedestal portion, wherein each semiconductor material has sidewall surfaces that are vertically coincident with sidewall surfaces of each trench isolation structure and a topmost surface that covers each semiconductor fin of the first and second arrays of semiconductor fins.

12. The method of claim 11, wherein said semiconductor material is epitaxially aligned with said topmost surface of each semiconductor pedestal portion and comprises a different semiconductor material than each semiconductor fin.

13. The method of claim 9, further comprising:
removing exposed portions of each semiconductor fin of the first array of semiconductor fins, and exposed portions of each semiconductor fin of said second array of semiconductor fins that are not covered by said functional gate structure or said dielectric spacer to expose a topmost surface of a semiconductor pedestal portion located beneath each semiconductor fin of the first and second arrays of semiconductor fins;
forming openings in each semiconductor pedestal portion; and
epitaxially growing said semiconductor material from said topmost surface of each semiconductor pedestal portion and within each opening, wherein each semiconductor material has sidewall surfaces that are vertically coincident with sidewall surfaces of each trench isolation structure and a topmost surface that covers each semiconductor fin of the first and second arrays of semiconductor fins.

14. The method of claim 13, wherein said semiconductor material is epitaxially aligned with each semiconductor pedestal portion and comprises a different semiconductor material than each semiconductor fin.

15. The method of claim 1, further comprising forming a punch-through stop doping region in said bulk semiconductor portion prior to said providing said first and second arrays of semiconductor fins.

16. The method of claim 1, further comprising forming a punch-through stop doping region in said bulk semiconductor portion after said providing said first and second arrays of semiconductor fins.

17. The method of claim 1, wherein said forming said trench comprises providing a bottle shaped trench.

18. The method of claim 17, wherein said providing said bottle shaped trench comprises an anisotropic etch, followed by an isotropic etch.

19. The method of claim 1, wherein each semiconductor fin of the first and second arrays of semiconductor fins is capped with a hard mask cap, wherein said hard mask cap remains on each semiconductor fin and separates a topmost surface of each semiconductor fin from a gate dielectric material portion of said functional gate structure.

20. The method of claim 1, wherein a topmost surface of each semiconductor fin of the first and second arrays of semiconductor fins exposed prior to forming said functional gate structure.

* * * * *